(12) United States Patent
Kang

(10) Patent No.: US 9,318,495 B2
(45) Date of Patent: Apr. 19, 2016

(54) SEMICONDUCTOR DEVICE INCLUDING CAPACITOR AND DOUBLE-LAYER METAL CONTACT AND FABRICATION METHOD THEREOF

(71) Applicant: SK hynix Inc., Icheon-si Gyeonggi-do (KR)

(72) Inventor: Chun Soo Kang, Yongin-si (KR)

(73) Assignee: SK Hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/489,880

(22) Filed: Sep. 18, 2014

(65) Prior Publication Data

US 2015/0004771 A1 Jan. 1, 2015

Related U.S. Application Data

(62) Division of application No. 13/365,332, filed on Feb. 3, 2012, now abandoned.

(30) Foreign Application Priority Data

Feb. 14, 2011 (KR) .......................... 10-2011-0012900

(51) Int. Cl.
*H01L 49/02* (2006.01)
*H01L 27/108* (2006.01)

(52) U.S. Cl.
CPC .... *H01L 27/10894* (2013.01); *H01L 27/10852* (2013.01); *H01L 28/91* (2013.01)

(58) Field of Classification Search
CPC .................. H01L 27/10852; H01L 27/10894; H01L 28/91
See application file for complete search history.

(56) References Cited

U.S. PATENT DOCUMENTS

| | | | | |
|---|---|---|---|---|
| 2003/0132479 A1* | 7/2003 | Nakamura | ........ | H01L 21/76801 257/315 |
| 2004/0097050 A1* | 5/2004 | Lin | .......... | H01L 28/60 438/393 |
| 2004/0104416 A1* | 6/2004 | Takaura | ............ | H01L 21/76895 257/296 |
| 2004/0113191 A1* | 6/2004 | Coursey | ............ | H01L 27/10855 257/296 |
| 2005/0042822 A1* | 2/2005 | Yoshida | .............. | H01L 21/2652 438/253 |
| 2007/0145494 A1* | 6/2007 | Ohashi | .............. | H01L 21/02129 257/390 |
| 2007/0241405 A1* | 10/2007 | Popoff | .................. | H01L 27/108 257/351 |
| 2007/0272963 A1* | 11/2007 | Kishida | ............. | H01L 27/10852 257/301 |
| 2008/0029801 A1* | 2/2008 | Nakamura | ........ | H01L 27/10852 257/303 |
| 2008/0116583 A1* | 5/2008 | Yuki | ................. | H01L 21/28525 257/774 |
| 2009/0090996 A1* | 4/2009 | Koo | .................. | H01L 21/76897 257/532 |
| 2009/0108318 A1* | 4/2009 | Yoon | ................... | H01L 21/8221 257/306 |
| 2010/0327410 A1* | 12/2010 | Park | ........................ | H01L 28/91 257/534 |

* cited by examiner

*Primary Examiner* — Kevin Parendo
(74) *Attorney, Agent, or Firm* — William Park & Associates Ltd.

(57) ABSTRACT

Disclosed are a semiconductor device comprising a capacitor and a double-layer metal contact and a method fabricating the same. The method comprising: forming a gate of a peripheral transistor for a peripheral circuit; forming a first contact and a first peripheral circuit wiring layer pattern on a first interlayer insulating layer; forming a second contact and a second peripheral circuit wiring layer pattern; selectively removing a portion of the second interlayer insulating layer in a cell region; forming a mold layer covering the second peripheral circuit wiring layer pattern; forming storage nodes passing through the mold layer; removing the mold layer; forming a dielectric layer and a plate node, which cover the storage nodes; forming a third interlayer insulating layer; and forming third contacts passing through the third interlayer insulating layer.

8 Claims, 12 Drawing Sheets

SEMICONDUCTOR DEVICE INCLUDING CAPACITOR AND DOUBLE-LAYER METAL CONTACT AND FABRICATION METHOD THEREOF

CROSS-REFERENCES TO RELATED APPLICATIONS

The present application claims priority under 35 U.S.C 119(a) to Korean Application No. 10-2011-0012900, filed on Feb. 14, 2011, in the Korean Intellectual Property Office, which is incorporated herein by reference in its entirety as set forth in full.

BACKGROUND

Embodiments of the present invention relate to a semiconductor device, and more particularly, to a semiconductor device comprising a capacitor, a double-layer peripheral circuit wiring line and a double-layer metal contact, and to a fabrication method thereof.

Many efforts have been made to increase the height of a capacitor so as to maximize capacitance characteristics of the capacitor in a limited area of a substrate, thereby increasing a data storage capacity of the DRAM semiconductor device. As the design rule shrinks, the technology node of DRAM is decreasing. For this reason, it is particularly difficult not only to ensure the storage capacitance (Cs) to ensure a sensing margin when sensing data stored in a storage node, but also to reduce a parasitic bit-line capacitance (Cb).

In technology nodes of 32 nm or below, a dimension of patterns is rapidly becoming smaller, thus making it substantially more difficult to utilize cylindrical storage nodes which have conventionally been used. For this reason, efforts have been made to significantly increase the height of a capacitor to ensure its capacitance characteristics. However, as the capacitor height increases rapidly, a step height after etching of a plate node also increases rapidly so that the etch process margin becomes rapidly smaller. Also, in a peripheral region in which peripheral circuits such as a sense amplifier (SA) are formed, a pattern pitch of wiring lines interconnecting the peripheral circuits decreases rapidly, thus making it difficult to use single patterning to form a pattern of the peripheral circuit wiring lines. For this reason, efforts have been made to apply double patterning technology (DPT).

In addition, as the capacitor height increases, the height of a metal contact (M1C) connecting a peripheral circuit wiring line or a plate node to a metal line (M1) also increases. Also, metal contact holes for metal contacts become deeper, and thus an occurrence of bridges between the metal contact holes increases. As the metal contact holes get deeper, a size relative to a top of the metal contact holes increases, the interval margin between the metal contact holes gradually narrows, and the amount of oxides that are lost in a cleaning process after formation of the metal contact holes increases so that the size of the holes increases. As the size of the metal contact holes increases, bridges between the contact holes occur more frequently. If the interval between the metal contact holes is increased in order to overcome the above-described shortcomings, the area of the peripheral region will increase due to the increase in the interval together with the increase in the size of the metal contact holes. Therefore the size of the whole device chip will increase, thus causing undesired results.

SUMMARY

An embodiment of the present invention relates to a semiconductor device including a capacitor and a metal contact and a fabrication method thereof, in which a height of storage nodes can be increased to ensure higher capacitance, and an occurrence of defects in peripheral circuit wiring lines and metal contacts for peripheral circuits can be effectively prevented.

In one embodiment, a method for fabricating a semiconductor device including a capacitor and a double-layer metal contact includes the steps of: forming a second interlayer insulating layer on a cell region and a peripheral region; forming a second contact which passes through a portion of the second interlayer insulating layer on the peripheral region; selectively removing a portion of the second interlayer insulating layer on the cell region while allowing a portion of the second interlayer insulating layer in the peripheral region to remain; forming a mold layer covering both the portion of the cell region from which the second interlayer insulating layer was removed and the second contact; forming storage nodes which pass through a portion of the mold layer in the cell region; selectively removing the mold layer to expose the storage nodes; forming a dielectric layer and a plate node, which cover the exposed storage nodes; forming a third interlayer insulating layer covering the plate node; and forming third contacts which pass through the third interlayer insulating layer so as to be connected to the plate node and the second contact, respectively.

In another embodiment, a method for fabricating a semiconductor device including a capacitor and a double-layer metal contact includes the steps of: forming a gate of a peripheral transistor for a peripheral circuit on a peripheral region of a semiconductor substrate including a cell region and the peripheral region; forming a first interlayer insulating layer covering the gate; forming a first contact and a first peripheral circuit wiring layer pattern, which are connected to the gate so as to constitute the peripheral circuit; forming a second interlayer insulating layer covering the first peripheral circuit wiring layer pattern; forming a second contact and a second peripheral circuit wiring layer pattern, which pass through the second interlayer insulating layer so as to constitute the peripheral circuit; selectively removing the portion of the second interlayer insulating layer on the cell region while allowing the portion of the second interlayer insulating layer in the peripheral region to remain; forming a mold layer covering both a portion of the semiconductor substrate from which the portion of the second interlayer insulating layer was removed and the second peripheral circuit wiring layer pattern; forming storage nodes which pass through a portion of the mold layer in the cell region; selectively removing the mold layer to expose the storage nodes; forming a dielectric layer and a plate node, which cover the exposed storage nodes; forming a third interlayer insulating layer covering the plate node; and forming third contacts which pass through the third interlayer insulating layer so as to be connected to the plate node and the second peripheral circuit wiring layer pattern, respectively.

In another embodiment, the peripheral circuit may include a sense amplifier which senses data to be stored in the storage nodes.

In another embodiment the method for fabricating the semiconductor may further include the steps of: forming bit lines which are insulated by a portion of the first interlayer insulating layer on the cell region; and forming storage node contacts which pass through the first interlayer insulating layer so as to be connected to the storage nodes, respectively.

In another embodiment, the step of forming the bit lines may include the steps of: forming damascene trenches in the first interlayer insulating layer; and forming the bit lines filling the damascene trenches.

In another embodiment, the step of forming the first peripheral circuit wiring layer pattern may include the steps of: obtaining a layout of the peripheral circuit wiring line for the peripheral circuit; extracting a layout of the first peripheral circuit wiring layer pattern, a layout of the second contact and a layout of the second peripheral circuit from the layout of the peripheral circuit wiring line; forming a first contact hole exposing the gate; forming the first peripheral circuit wiring layer, which fills the first contact hole, on the first interlayer insulating layer; and selectively etching the first circuit wiring layer so as to have a configuration corresponding to the layout of the first peripheral circuit wiring layer pattern, thus forming the first contact and the first peripheral circuit wiring layer pattern.

In another embodiment, the step of forming the second peripheral circuit wiring layer pattern may include the steps of:

forming the second contact hole, which passes through the second interlayer insulating layer, so as to have a configuration corresponding to the layout of the second contact; forming the second peripheral circuit wiring layer, which fills the second contact hole, on the second interlayer insulating layer; and selectively etching the second peripheral circuit wiring layer so as to have a configuration corresponding to the layout of the second peripheral circuit wiring layer pattern, thus forming the second contact and the second peripheral circuit wiring layer pattern.

In another embodiment, the step of selectively removing the portion of the second interlayer insulating layer on the cell region may include the steps of: forming on the second interlayer insulating layer a mask pattern for exposing the cell region; and selectively etching out a portion of the second interlayer insulating layer exposed through the mask pattern.

In another embodiment, the method may further include a step of forming at an interface between the mold layer and the remaining second interlayer insulating layer an etch stopper extending to cover the second peripheral circuit wiring layer pattern, in which the etch stopper may protect the second interlayer insulating layer when the mold layer is removed.

In another embodiment, the step of forming the dielectric layer and the plate node may include the steps of: forming layers for the dielectric layer and the plate node so as to extend onto the etch stopper exposed by removal of the mold layer; and selectively etching out the portion of the dielectric layer for the plate node, which overlaps with the remaining portion of the second interlayer insulating layer, thus patterning the plate node, in which the third contacts which are connected to the plate node may be located on the remaining portion of the second interlayer insulating portion.

In another embodiment, the method may further include a step of forming on the mold layer a support layer for supporting the storage nodes.

In one embodiment, a semiconductor device including: a cell region and a peripheral region; storage nodes formed in the cell region; a second contact passing through a second interlayer insulating layer formed on the peripheral region; a dielectric layer and a plate node, which cover the storage node and of which the end extends onto the second interlayer insulating layer; a third interlayer insulating layer covering the plate node and the second interlayer insulating layer; and third contacts which pass through the second interlayer insulating layer so as to be connected to both a portion of the plate node on the second interlayer insulating layer and the second contact, respectively.

In another embodiment, a semiconductor device may include: a semiconductor substrate including a cell region and a peripheral region; a peripheral transistor and a gate, which are formed on the peripheral region of the semiconductor substrate to constitute a peripheral region; a first interlayer insulating layer formed to cover the gate; a first contact and a first peripheral circuit wiring layer pattern, which are formed on a portion of the first interlayer insulating layer on the peripheral region so as to be connected to the gate and to constitute the peripheral circuit; a second interlayer insulating layer formed on the peripheral region to cover the first peripheral circuit wiring layer pattern; a second contact and a second peripheral circuit wiring layer pattern, which are formed to pass through the second interlayer insulating layer so as to constitute the peripheral circuit; storage nodes formed on a portion of the first interlayer insulating layer on the cell region; a dielectric layer and a plate node, which cover the storage nodes and of which the end extends onto the second interlayer insulating layer; a third interlayer insulating layer covering the plate node and the second interlayer insulating layer; and third contacts which pass through the second interlayer insulating layer so as to be connected to both a portion of the plate node on the second interlayer insulating layer and the second peripheral circuit wiring layer pattern, respectively.

In another embodiment, the peripheral circuit may include a sense amplifier that senses data to be stored in the storage nodes.

In another embodiment, the semiconductor device may further include an etch stopper which is formed at an interface between the second and third interlayer insulating layers and extends onto the first interlayer insulating layer to support the sides of a lower portion of the storage node and to isolate the storage nodes from the second interlayer insulating layer.

In another embodiment, the height of the second contact may be 45-70% of the height of the storage node.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Figure 1:
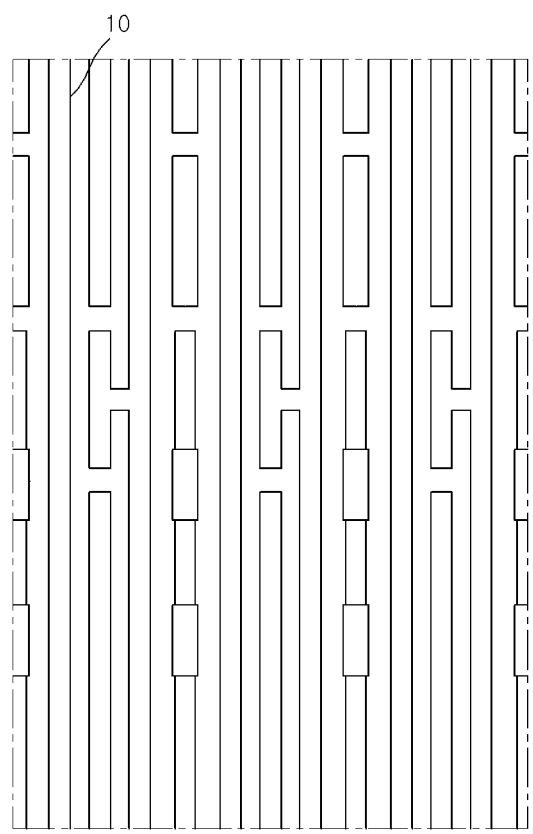
FIGS. 1 to 4 show layouts of peripheral circuit wiring lines for peripheral circuits according to an embodiment of the present invention.

Hereinafter, embodiments of the present invention will be described with reference to the accompanying drawings. However, the embodiments are for illustrative purposes only and are not intended to limit the scope of the invention.

An embodiment of the present invention proposes a method of ensuring the capacitance of a capacitor by forming storage nodes having increased height in a substrate area which is limited as a result of a rapid reduction in the design rule of semiconductor devices. In addition, according to an embodiment, peripheral circuit wiring lines, such as a first metal layer (MT0), which are substantially impossible to form by a single patterning process, are formed of a double layer consisting of two layers without using a double patterning technology (DTP) process which cannot ensure an adequate patterning margin. The upper and lower layers of the double layer for the peripheral circuit wiring lines are connected to each other by a metal contact (second M0C) to constitute peripheral circuits such as a sense amplifier (SA).

As used herein, the term "MT0" refers to a peripheral circuit wiring layer that connects peripheral circuit transistors, formed in the peripheral region of a DRAM device, to constitute peripheral circuits such as SA or a sub-word driver (SWD). The term "M0C" refers to an interconnection contact that connects the peripheral circuit wiring layer with the peripheral transistors. In a DRAM device metal wiring lines, each generally consisting of two layers mean a first metal wiring line (M1) and a second metal wiring line (M2), and a metal contact connecting M1 with M0C is referred to as M1C. In an embodiment of the present invention, when MT0 consisting of two layers are introduced, the second MT0 that is the second layer is formed at about half of the height of a storage node (SN), thus increasing the patterning margin of M1C.

Considering the patterning margin of the second M0C formed by introducing the second MT0 as the second layer and the patterning margin of M1C, the MT0 layer is formed at about half of the height of SN, a depth of M1C can be increased so that an increase in a dimension of the contact holes can be prevented, thus preventing the occurrence of a bridge between the contact holes. Herein, the second M0C can have a relatively large pitch, and thus even when the depth of a contact hole for the second M0C is increased, there is no substantial loss in the patterning margin, and thus the height of the second MT0 can be increased. Also, because the level of the second MT0 can be elevated to half of the height of an SN, the step height of a plate node (PN) can be reduced to increase the patterning margin of the PN. Thus an M1C that is connected to the plate node can become closer to the cell region, thus reducing the design rule to reduce the chip size of the semiconductor device. In addition, after patterning of the second MT0, a silicon nitride layer ($Si_3N_4$) for stopping the etching of SN is formed to fill between MT0s, whereby a punch phenomenon resulting from the misalignment of M1C and MT0 can be inhibited.

In an embodiment of the present invention, the first MT0 layer is referred to as the "first peripheral circuit wiring layer", the second MT0 as the "second circuit wiring layer", the first M0C as "the first contact", the second M0C as the "second contact", and the M1C as the "third contact".

FIGS. 1 to 4 show layouts of peripheral circuit wiring lines for peripheral circuits according to embodiments of the present invention.

Referring to FIG. 1, peripheral circuits may be circuits for sensing the data stored in memory cells, such as a sense amplifier (SA). The peripheral circuits may be integrated in a peripheral region to order to control an operation of memory cells integrated in a cell region of a semiconductor device such as a DRAM memory device. The memory cell may comprise a cell transistor formed at an intersection between a bit line and a word line. The memory cell may also comprise a capacitor comprising storage nodes for storing data, the capacitors may be connected to a source of the cell transistor.

A SA that reads out data stored in a storage node may be a circuit comprising peripheral circuit wiring lines connecting peripheral transistors to each other, where the peripheral transistors may be formed in a peripheral region. Such peripheral circuit wiring lines are formed of patterns having a wiring line layout 10 as shown in FIG. 1. For 30-nm technology node DRAM devices, a pattern pitch of the peripheral circuit wiring lines may be set at 73 nm based on a minimum pitch. The first metal contact (M1C) is connected to the first metal wiring line (M1). Herein, if the height of the storage node of a capacitor is 22000 Å or higher in order to ensure the capacitance of the capacitor, the depth (or height) of M1C will correspond to the height of the storage node. If an interlayer insulating layer having a thickness of about 4000 Å is added thereto, the height of the storage node will increase to about 26000 Å. When a contact hole for this deep M1C is formed by etching, the sidewall profile of the contact hole is inclined in order to ensure etching properties and the opening of the bottom. Thus the interval between adjacent M1Cs can become narrower so that the adjacent M1Cs can be bridged to each other. In an embodiment of the present invention, the depth (or height) of M1Cs is reduced, whereby the etching margin and bottom opening properties in the contact hole process for forming M1Cs are improved and the occurrence of a bridge between M1Cs is effectively inhibited. Also, when the pattern pitch of peripheral circuit wiring lines to which M1C is to be connected is only 73 nm base on the minimum pitch, when M1C is connected to a peripheral circuit wiring pattern having a small dimension, it can be connected to other peripheral circuit wiring patterns due to misalignment, thus causing short circuits. In an embodiment of the present invention, the peripheral circuit wiring lines are not formed of a single layer, but are formed of a double layer, thus alleviating the problem of shorts in the wiring patterns.

Figure 2:
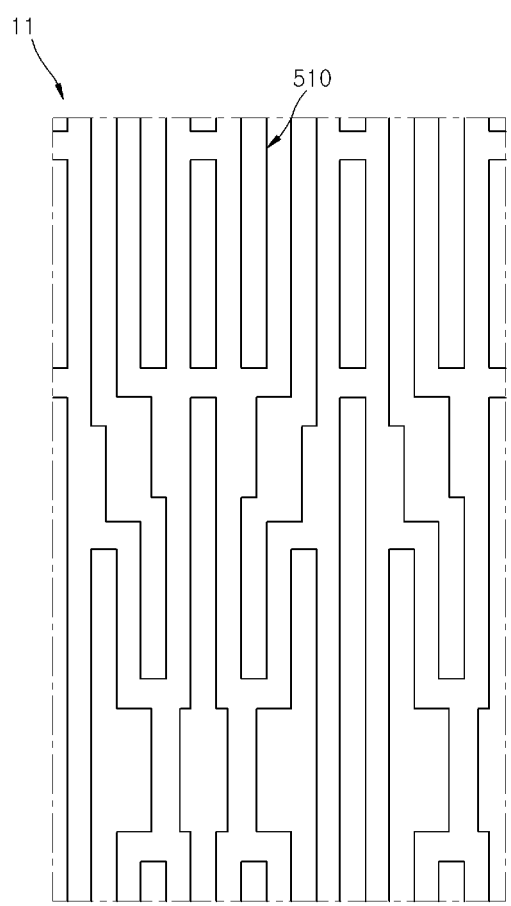
Figure 3:
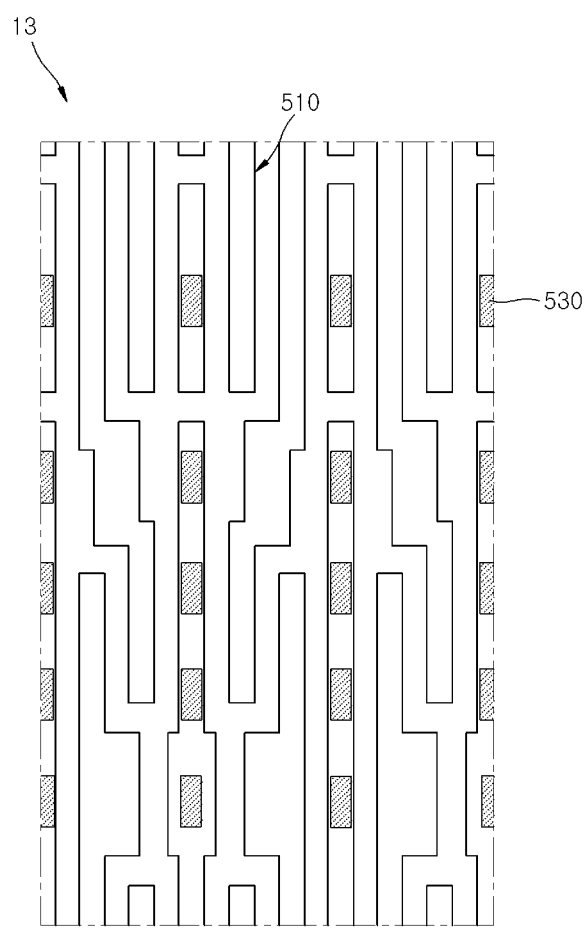
Figure 4:
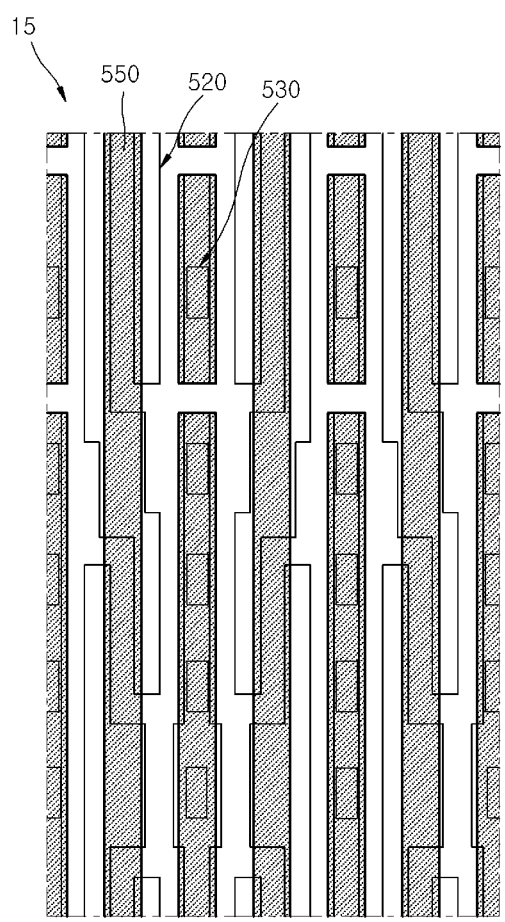

From the layout 10 of the peripheral circuit wiring lines designed as a single layer as shown in FIG. 1, a layout 11 of first peripheral wiring layer patterns as shown in FIG. 2 and a layout 15 of second peripheral circuit wiring layers as shown in FIG. 4 are extracted. First peripheral circuit wiring layer patterns 510 in FIG. 2 are introduced as a lower layer, and second peripheral circuit wiring layer patterns 550 are introduced as an upper layer. Also, a layout 13 of interconnection contacts 530 as shown in FIG. 3 is extracted to connect the first peripheral circuit wiring layer patterns 510 to the second peripheral circuit wiring layer patterns 550 such that the first peripheral circuit wiring layer patterns 510 and the second peripheral circuit wiring layer patterns 550 provide peripheral circuits (e.g., SA circuits) which have a layout having substantially the same as the layout 10 of the peripheral circuit wiring lines of FIG. 1. Such first peripheral circuit wiring layer patterns 510, second peripheral circuit wiring layer patterns 550 and interconnection contacts 530 are formed to have a double-layer structure, but are designed to constitute peripheral circuits (e.g., SA circuits) which have a substantially same layout as peripheral circuits having the single-layer layout 10 of FIG. 1.

The peripheral circuit wiring lines are formed to have the double-layer structure as described above, whereby the pattern pitch of the first peripheral circuit wiring layer pattern 510 can be set at larger than 104 nm based on the minimum pitch, and the pattern pitch of the second peripheral circuit wiring layer pattern 550 can be set at larger than 156 nm based on the minimum pitch. Thus, it is possible to effectively overcome problems which can occur due to a reduction in the pattern pitch, such as short circuits or punch defects resulting from bridging or misalignment. Furthermore, the interval between adjacent interconnection contacts 530 can be set at 200 nm or more, unlike the case in which the interval between MICs for peripheral circuit wiring lines having a single-layer structure is only 73 nm. Thus, the occurrence of bridges between the contacts can be effectively inhibited. Also, as the pitch between the peripheral circuit wiring layer patterns 510 and 550 is increased, the bit-line coupling capacitance can be reduced, and a mismatch of signals can also be reduced.

FIGS. 5 to 14 are cross-sectional views showing a semiconductor device, which comprises a capacitor and a double-layer metal contact, according to an embodiment of the present invention, and a method for fabricating the semiconductor device. Although embodiments of the present invention are illustrated by example of a 30-nm technology node DRAM memory device, it can be applied not only to DRAM memory devices having smaller technology nodes, but also when the height of metal contacts become higher and it is difficult to ensure an interval between metal contacts.

Figure 5:
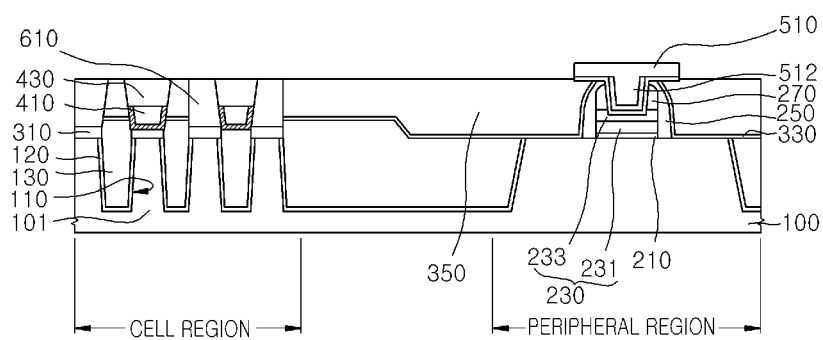
FIGS. 5 to 14 are cross-sectional views showing a semiconductor device comprising a capacitor and a double-layer metal contact according to an embodiment of the present invention, and a method for fabricating the semiconductor device.

Referring to FIG. 5, a field layer 130 defining an active region 101 is formed on a semiconductor substrate 100 such as a silicon (Si) wafer. The field layer 130 can be formed by subjecting the semiconductor substrate 100 to a shallow trench isolation (STI) process. The STI process may form isolation trenches 110, forming a liner 120 consisting of a wall oxide layer, a silicon nitride ($Si_3N_4$) layer and a silicon oxide ($SiO_2$) layer in the trenches, and then a forming a silicon oxide layer filling the isolation trenches 110. In the cell region of the semiconductor device 100, cell transistors forming memory cells for DRAM devices can be formed, and in a peripheral region surrounding the cell region, peripheral circuit wiring lines and peripheral transistors, which constitute peripheral circuits such as sense amplifiers (SAs), can be formed. The peripheral region can comprise a peripheral circuit region or a core region.

Herein, the cell transistors (not shown) may have a buried gate structure in order to ensure an increased channel length in a limited small area resulting from a reduction in the design rule. In other words, the cell transistors may be formed to have a structure in which a gate trench in which a gate is to be buried is formed across the active region 101 of the semiconductor substrate 100 and the cell gate is buried in the gate trench. In addition, in the peripheral region of the semiconductor substrate 100, a peripheral gate 230 for a peripheral transistor may be formed on a gate dielectric layer 210. The gate 230 may be formed of either a double layer consisting of a poly-silicon layer 231 and a tungsten layer 233 or a metal layer such as a titanium nitride (TiN) or tungsten layer. On a sidewall of the peripheral gate 230, a gate spacer 250 formed of an insulating layer such as silicon nitride may be attached, and on the gate 230, a gate capping layer 270 may be formed of an insulating layer such as silicon nitride. A protective layer 330 that covers the gate capping layer 270 and the gate spacer 250 may be formed of an insulating layer such as silicon nitride in the form of a liner.

In the active region of the semiconductor substrate 100, a landing plug 310 may be formed as a conductive layer such as a poly-silicon layer. The landing plug 310 may be formed either as an interconnection contact connecting the active region to bit lines 410 or interconnection contacts which are connected to the storage nodes of the capacitor. This landing plug 310 electrically connects the bit lines 410 to the drain of the cell transistor in the cell region and electrically connects the storage nodes of the capacitor to the source of the cell transistor.

On the resulting semiconductor substrate 100 on which the landing plug 310 and the peripheral gate 230 were formed, a first interlayer insulating layer 350 is formed. The first interlayer insulating layer 350 may comprise an insulating layer such as silicon oxide. Bit lines 410 that pass through the first interlayer insulating layer 350 so as to be connected to some of the landing plugs 310 is formed using a damascene process. For example, the bit lines 410 are formed by recessing the first interlayer insulating layer 350 to form damascene trenches, forming a titanium nitride (TiN) layer as a barrier metal layer in the damascene trenches, and then forming a tungsten (W) layer on the barrier metal layer. Herein, on the sidewall of the bit lines 410, bit line spacers (not shown) for ensuring lateral insulation from storage node contacts 610 may be further formed. Then, a bit line capping layer 430 for insulating the upper side of the bit lines 410 may be formed and the bit line capping layer 430 may comprise an insulating layer such as a silicon nitride layer. Then, storage node contacts 610 that pass through the first interlayer insulating layer 350 of the cell region so as to be connected to the landing plugs 310 may be formed by a self-aligned contact (SAC) process.

On the resulting semiconductor substrate 100 on which the bit lines 410 and the storage node contacts 610 were formed, a first peripheral circuit wiring layer pattern 510 is formed on the first interlayer insulating layer 350. A first contact hole is formed, where the contact is aligned with the peripheral gate 230 to expose an upper surface of the gate 230, and a first peripheral circuit wiring layer filling the first contact hole is also formed. The first peripheral circuit wiring layer can be formed by depositing a barrier metal (BM) layer comprising titanium/titanium nitride (Ti/TiN) and a tungsten layer on the barrier metal layer to fill the first contact hole. Herein, a chemical mechanical polishing (CMP) for surface planarization of the tungsten layer may be carried out. Then, a mask (not shown) having a configuration corresponding to the layout of the first peripheral circuit wiring layer pattern 510 as shown in FIG. 2 is formed on the first peripheral circuit wiring layer, and an exposed portion of the first peripheral circuit wiring layer is selectively etched out to form the first peripheral circuit wiring layer pattern 510. The portion of the first peripheral circuit wiring layer pattern 510 that fills the first contact hole is set as a first contact 512.

Figure 6:
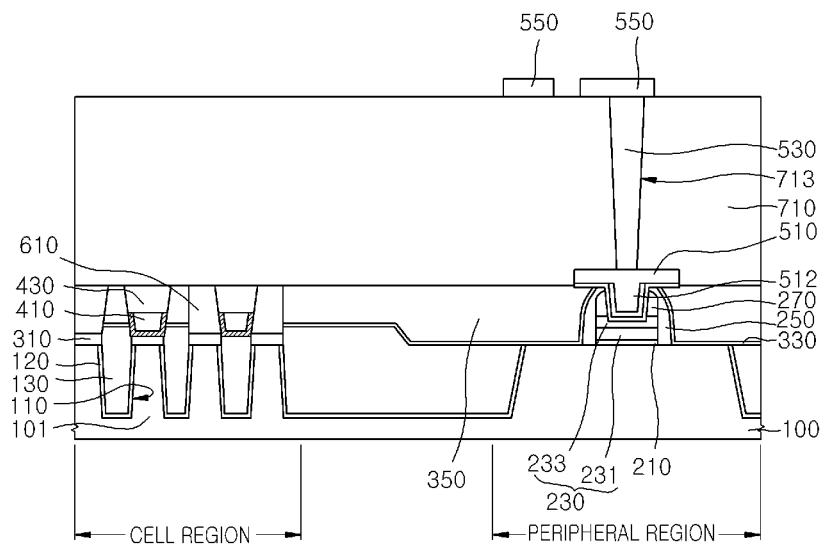

Referring to FIG. 6, a second interlayer insulating layer 710 covering the first peripheral circuit wiring layer pattern 510 is formed on the first interlayer insulating layer 350. It may be formed by depositing an insulating material such as silicon oxide and then planarizing the deposited material by CMP. Herein, a height or thickness of the second interlayer insulating layer 710 may be formed to a thickness corresponding to about 45-70% of a height of the storage node. For example, when the storage node is formed to a thickness of about 22000 Å, the second interlayer insulating layer 710 may be formed to a thickness of about 10000-15000 Å. Although not shown in the figures, before the second interlayer insulating layer 710 is deposited, a first etch stopper covering the first peripheral circuit wiring layer pattern 510 may be formed by depositing an insulating layer (such as a silicon nitride layer) having an etch selectivity with respect to silicon oxide.

A second contact hole 713 passing through the second interlayer insulating layer 710 is formed using a mask (not shown) and an etching process. Herein, the mask for the second contact hole 713 is formed to have a configuration corresponding to the layout of the interconnection contacts 530 as shown in FIG. 3. The second contact hole 713 may be formed by selectively etching the portion of second interlayer insulating layer 710 exposed through the mask. The second contact hole 713 may be formed so as to correspond to the position of the interconnection contact 530. Herein, the second contact hole 713 should be aligned with the first contact hole or the portion of first peripheral circuit wiring layer pattern 510 overlapping with the first contact hole, but the overlap can be somewhat misleading due to misalignment. When the overlap margin is inadequate as described above, a first etch stopper (not shown) can be introduced, thereby preventing the second contact hole 713 from exposing the underlying active region 101 or the adjacent gate 230.

A second peripheral circuit wiring layer filling the second contact hole 713 is deposited. For example, it can be formed by depositing a tungsten layer on the second interlayer insulating layer 710 to fill the second contact hole 710 and subjecting the tungsten layer to CMP. Although not shown in the figure, a barrier metal layer comprising titanium nitride (TiN) may be formed, before the tungsten layer is deposited. A mask (not shown) having a configuration corresponding to the layout of the second peripheral circuit wiring layer patterns 550 is formed on the second peripheral circuit wiring layer, and the exposed portions of the second peripheral circuit wiring layer are selectively etched out to form the second peripheral circuit wiring layer pattern 550. The portion of the second peripheral circuit wiring layer pattern that fills the second contact hole 713 is set as a second contact 530. The second contacts 530 are set to correspond to the configuration of the interconnection contacts 530 as shown in FIG. 3.

Figure 7:
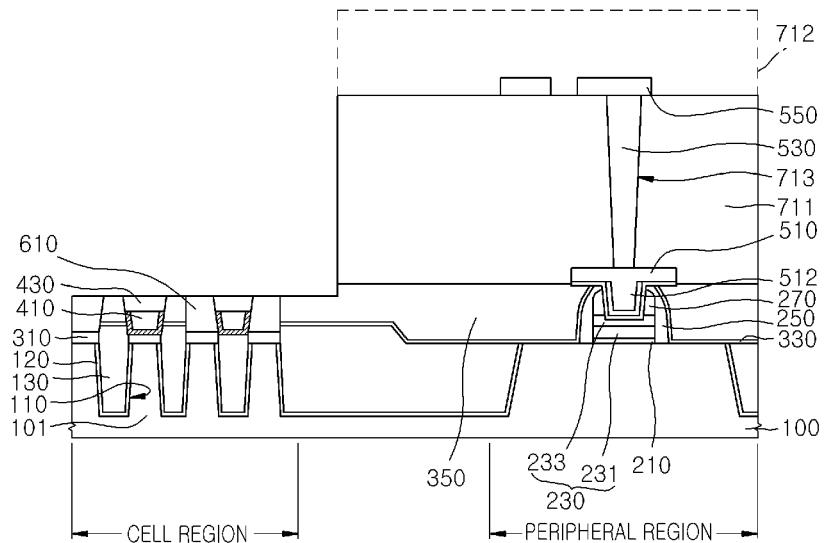

Referring to FIG. 7, a portion of the second interlayer insulating layer 710 (see FIG. 6) that was formed on the cell region is selectively removed such that a remaining portion 711 of the second interlayer insulating layer 710 that was formed on the peripheral region remains to form a remaining second insulating layer 711. For this purpose, a mask pattern 712 for exposing the cell region is formed on the second interlayer insulating layer 710, and the portion of second interlayer insulating layer 710 exposed through the mask pattern 712 is selectively etched out, thereby exposing the upper surface of the storage node contacts 610 in the cell region.

Figure 8:
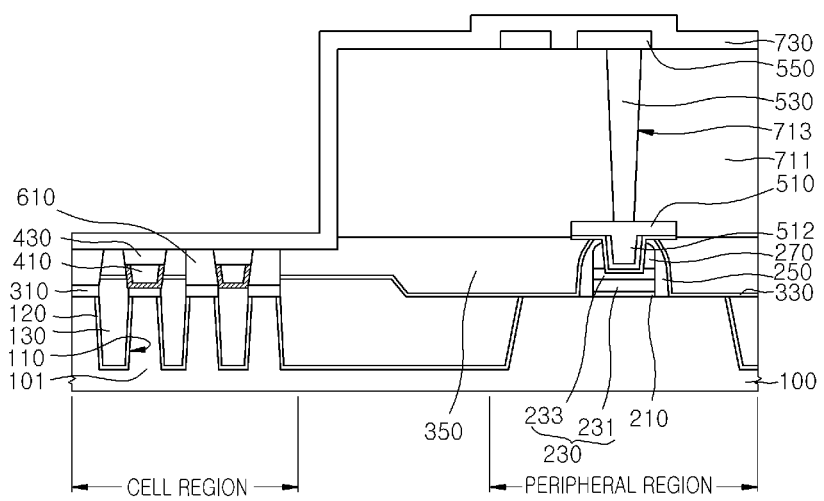

Referring to FIG. 8, a second etch stopper 730 covering the second peripheral circuit wiring layer pattern 550 is formed on the remaining second interlayer insulating layer 711. The second etch stopper 730 can be formed by depositing an insulating layer such as a silicon nitride layer, which has an etch selectivity with respect to silicon oxide, to a thickness ranging from several ten Å or 200 Å to 1000 Å. The second etch stopper 730 isolates the remaining second interlayer insulating layer 711 from the cell region to protect the remaining second interlayer insulating layer 711 from a subsequent capacitor process.

Figure 9:
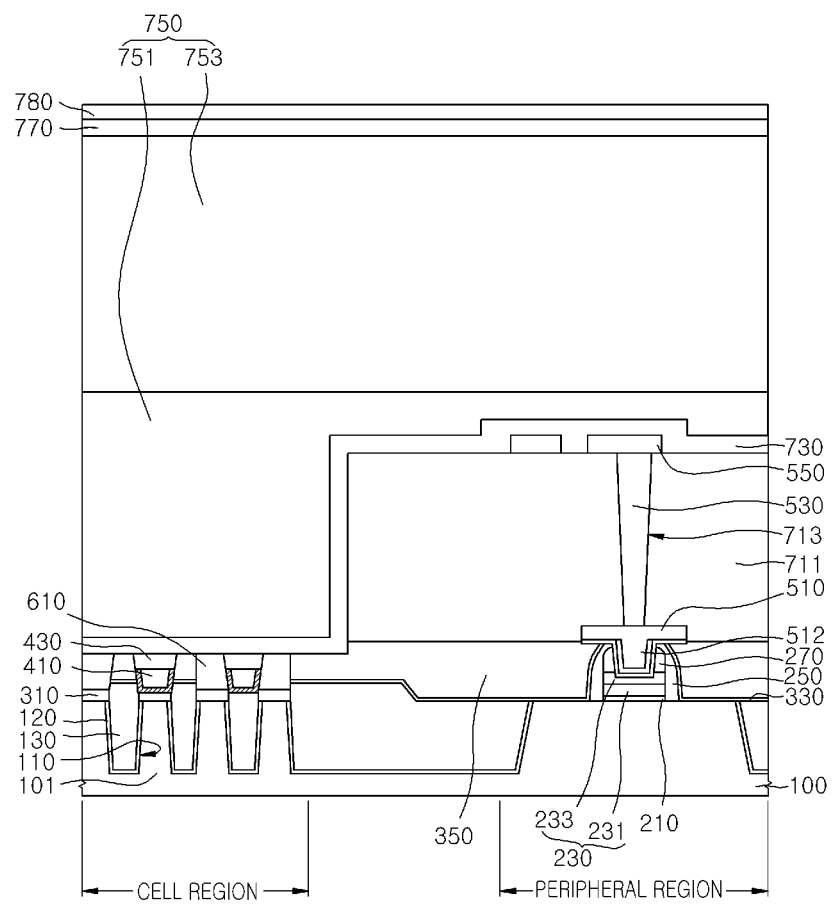

Referring to FIG. 9, a mold layer 750 serving as a mold for imparting a shape to the storage nodes is formed on the second etch stopper 730. The second etch stopper 730 can act as an etch stop point when the mold layer 750 in the cell region is patterned and etched.

The mold layer 750 may be formed as a stack of a plurality of insulating layers which have different etch rates such that a through-hole which is to impart a shape to the storage node can be formed to have a sufficient depth. For example, the mold layer 750 can be formed as a stack structure comprising a phosphorous silicate glass (PSG) layer 751 having a relatively high etch rate and a plasma-enhanced tetraethylorthosilicate (PE-TEOS) layer 753 having a relatively low etch rate. In some cases, the mold layer 750 may also be formed as a single layer of PSG or TEOS. This mold layer 750 may be formed to a thickness that provides a required height of the storage node, where the required height is determined by considering the capacitor capacitance that is to be achieved. For example, the mold layer 750 may be formed to a thickness of 22000 Å or more.

A support layer may be formed on the mold layer 750. The support layer 770 may support the sides of the upper portion of the storage nodes to prevent the storage nodes from falling down or leaning. The support layer 770 may comprise an insulating layer such as a silicon nitride ($Si_3N_4$) layer which has an etch selectivity with respect to the mold layer 750. On the support layer 770, a protective capping layer 780 may be formed in order to protect the support layer 770 in a subsequent etching process and may comprise a silicon oxide ($SiO_2$) layer.

Figure 10:
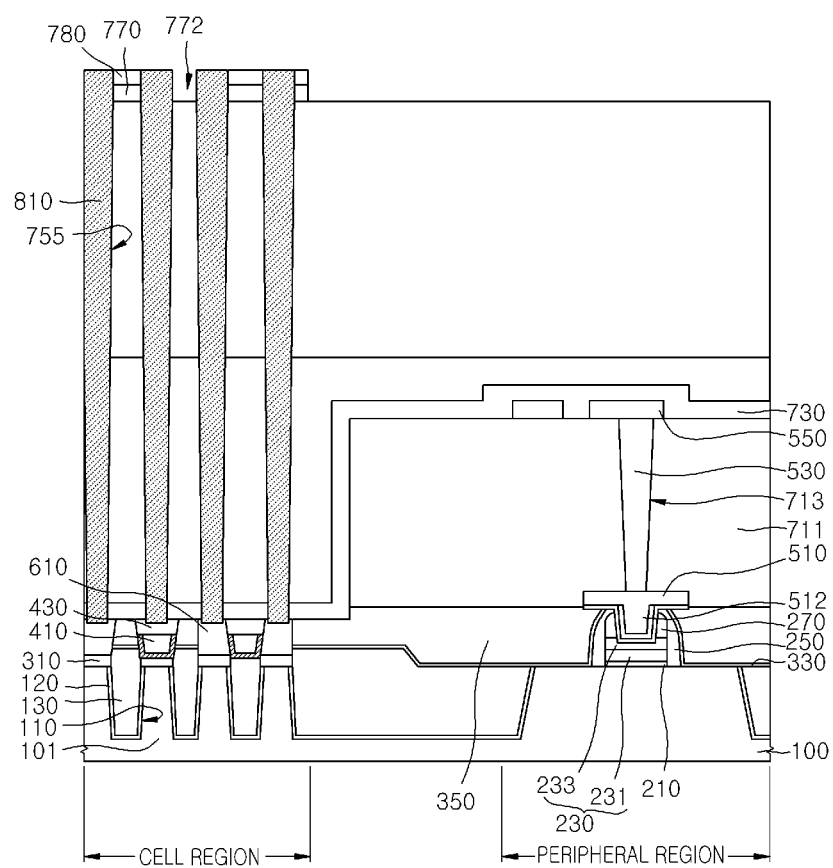

Referring to FIG. 10, second though-holes 755 are formed which pass through the protective capping layer 780, the support layer 770 and the mold layer 750 to expose the underlying storage node contacts 610. Formation of such second through-holes 755 can be performed by a selective dry etching process. Then, storage nodes 810 are formed by depositing a storage node layer to fill the through-holes 755 and then planarizing the deposited storage node layer by an etch back or CMP process. The storage nodes 810 may comprise a metal layer such as a titanium nitride (TiN). The storage node 810 is formed in a pillar shape filling the through-hole 755. The storage node is difficult to form in a cylindrical shape, because the depth of the through-hole 755 is 20000 Å or more and the size of the through-hole 755 is greatly reduced to increase the aspect ratio.

Then, a portion of the protective capping layer 780 and the support layer 770 is selectively removed to form an opening 772 exposing a portion of the upper surface of the mold layer 750 (see FIG. 9). The opening 772 may be formed such that it is located in the cell region, and during formation of the opening 772, a portion of the protective capping layer 780 and the support layer 770, which is located in the peripheral region, may be selectively removed. The opening 772 can be used as a channel into which a wet etching solution is introduced during the process of selectively removing a portion of the mold layer 750 to expose an outer sidewall of the storage nodes 810.

Figure 11:
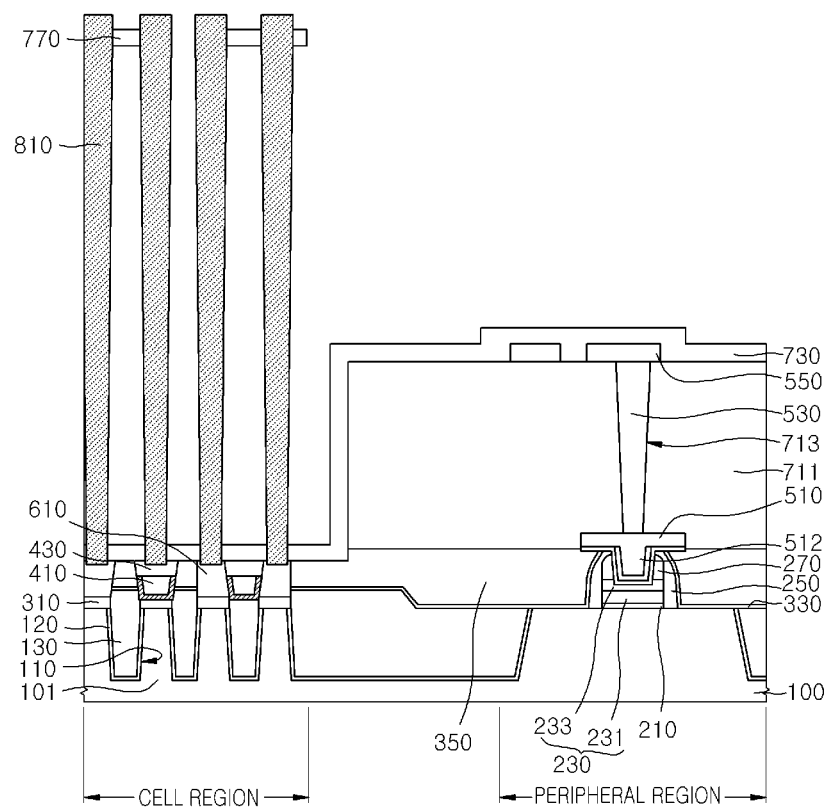

Referring to FIG. 11, the portion of the mold layer 750 exposed through the opening 772 is removed by wet etching using an oxide etching solution such as BOE (buffer oxide etchant) or diluted hydrofluoric (HF) acid solution. The wet etching solution comes into contact with the mold layer 750 through the opening 772 to remove a portion of the mold layer 750, and subsequently the oxide etching solution is introduced to continuously remove a portion of the mold layer 750. This opening 772 is used as a channel for removing a portion of the mold layer 750 by wet etching and can be used as a channel into which a source is introduced during a subsequent process of depositing a dielectric layer and a plate node layer.

In this wet etching process, the portion of the remaining second interlayer insulating film 711 formed on the peripheral region remains without being influenced by wet etching, because it has been isolated from the cell region by the second etch stopper 730.

Figure 12:
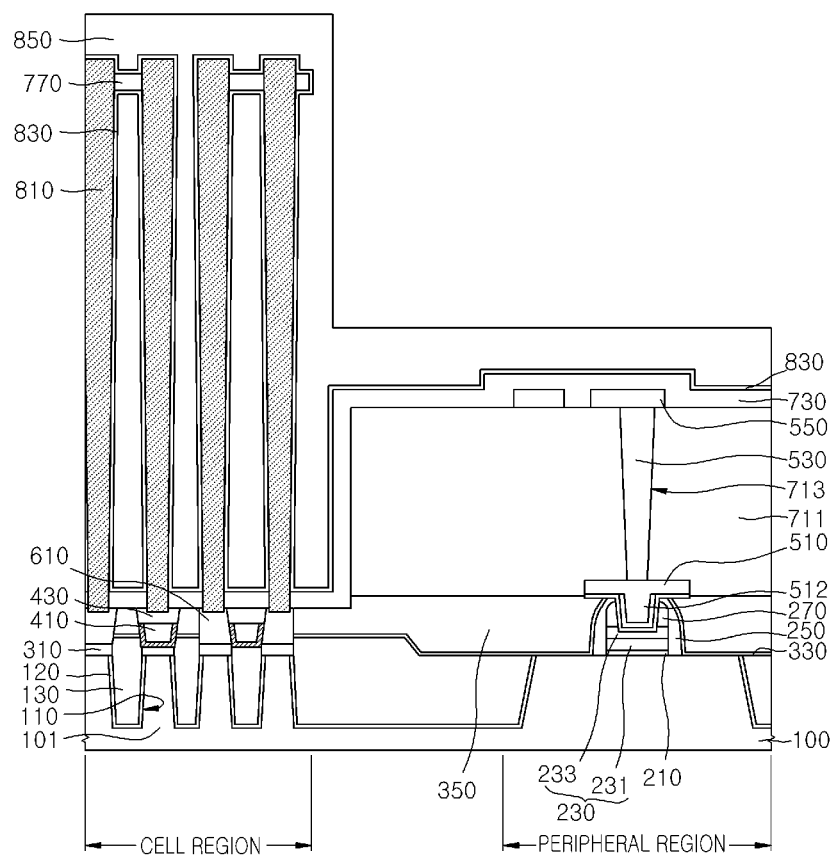

Referring to FIG. 12, a dielectric layer 830 is formed on the outer sidewall of the storage nodes 810, and a plate node layer 850 is deposited on the dielectric layer 830. Thus, a cell capacitor having increased capacitance resulting from the increased height of the storage nodes 810 is achieved. The dielectric layer 830 may be formed by depositing a material having high dielectric constant (k), such as zirconium oxide ($ZrO_2$). Alternatively, the dielectric layer 830 may be formed as a composite layer of zirconium oxide-aluminum oxide ($Al_2O_3$)-zirconium oxide (ZAZ). The plate node layer 850 may be formed by depositing titanium nitride (TiN) and tungsten (W). Because the remaining second interlayer insulating layer 711 is located as the lower layer on the peripheral region, a step height difference of the plate node layer between the cell region and the peripheral region can be reduced by about half compared to the case in which the remaining second interlayer insulating layer 711 is not present. Thus, in a subsequent process of patterning the plate node layer 850, improvement in the process margin can be achieved due to a reduction in the step height.

Figure 13:
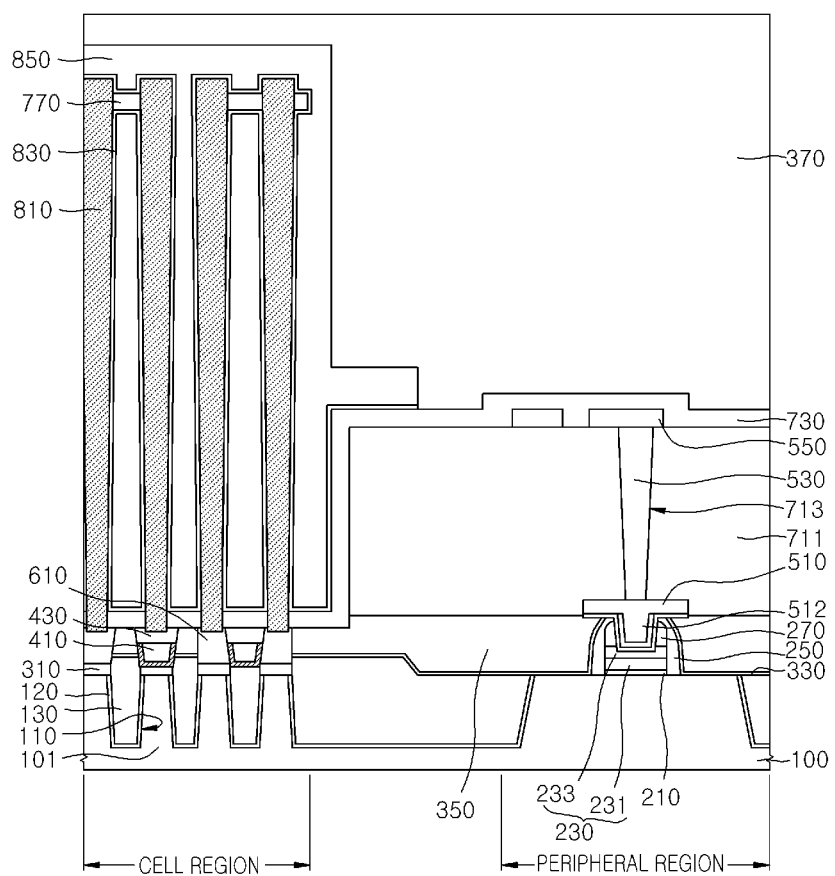

Referring to FIG. 13, a portion of the plate node layer 850 and the dielectric layer 830, which was formed in the peripheral region, is selectively removed. The portion of the plate node layer 850 that overlaps with the remaining portion of the second interlayer insulating layer 711 is selectively removed. Herein, a higher etching process margin can be ensured due to the reduced step height difference, and thus the end of the patterned plate node 850 can be located closer to the cell region. The etching process can stop on the second etch stopper 730. Then, a third interlayer insulating layer 370 covering the patterned plate node 850 is deposited on the exposed second etch stopper 730.

Figure 14:
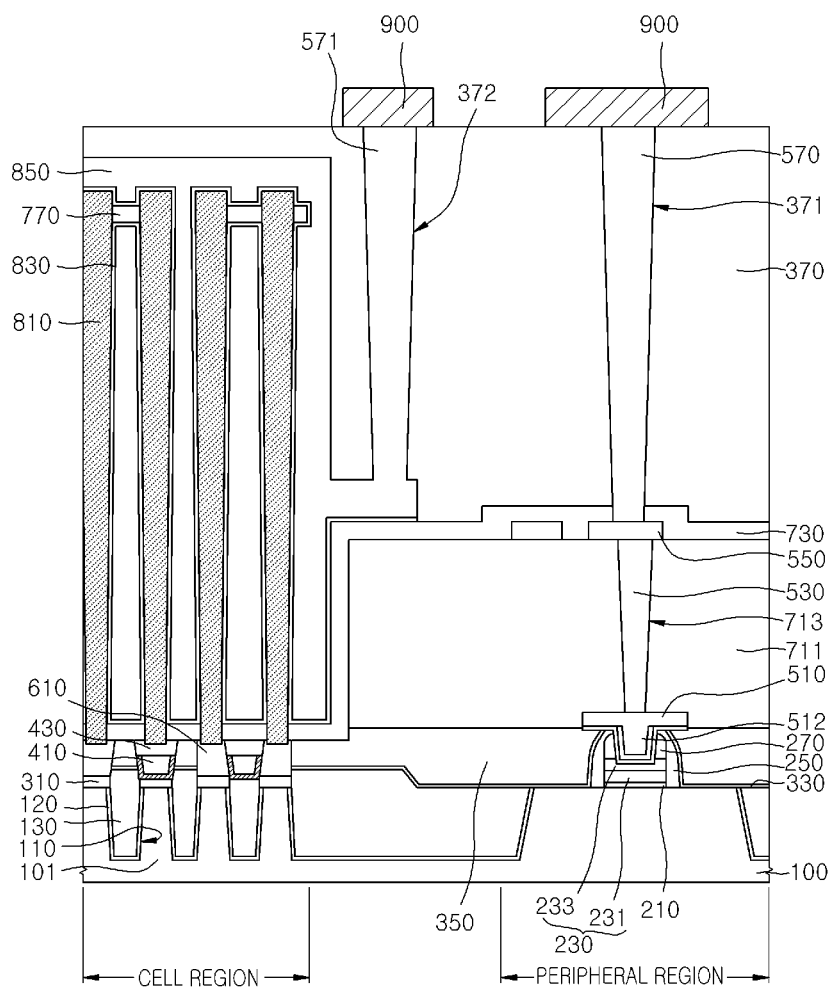

Referring to FIG. 14, third contact holes 371 and 372 passing through the third interlayer insulating layer 370 are formed by a selective etching process. Specifically, a first hole 371 for third contacts, which is aligned with the second peripheral circuit wiring layer pattern 550 or the second contact 530, and a second hole 372 for third contacts, which is connected to the plate node 850, may be formed. Such third contact holes 371 and 372 have a depth corresponding to about half or less of the height of the storage nodes 810, because the remaining second interlayer insulating layer 711 is located under the third contact holes. Thus, the occurrence of misalignment or the size of the holes can be reduced so that the interval between the third contact holes 371 and 372 can become wider. Thus, the step height of the plate node 850 can be reduced so that the end of the plate node 850 can be located closer to the cell region, whereby the position of the third contact hole 372 that is connected to the end of the plate node 850 can become closer to the cell region.

Then, third contacts 570 and 571 are formed by depositing conductive layers, for example, a barrier metal layer of tungsten nitride and a tungsten layer, to fill the third contact holes 371 and 372, and planarizing the deposited conductive layers by CMP. The third contact 570 is aligned with the second peripheral circuit wiring layer pattern 550 or the second contact 530, so that the third contact 570 together with the second contact 530 provides a metal contact (M1C) that connects a first metal wiring line (M1) 900 to the semiconductor substrate 100 or the peripheral gate 230. Because M1C consists of a stack of the second contact 530 and the third contact 570, an increase in the size of the contact hole can be effectively inhibited, even though the total depth (or height) of M1C increases as the height of the storage node 810 increases.

Thus, the interval between adjacent M1Cs, each consisting of the second contact 530 and the third contact 570, can be increased, so that an occurrence of bridges between M1Cs resulting from the narrow interval between the M1Cs can be effectively inhibited. Because M1C 530 consisting of a stack of the contacts 530 and 570 allows a reduction in the height of each of the second contact 530 and the third contact 570, which are actually formed, the depths of contact holes for the contacts can be reduced, thus ensuring an overlap margin. Thus, short circuiting or punch phenomena resulting from the misalignment M1C 530 and 570 can be effectively prevented.

Also, because the third contact 571 can be located closer to the cell region, the interval between the third contact 517 and the storage nodes 810 or between M1C (consisting of the contacts 530 and 570) and the storage nodes 810 can be reduced. Thus, the total size of a semiconductor chip comprising such metal contacts and storage nodes 810 can be efficiently reduced.

After the third contacts 570 and 571 have been formed, first metal wiring lines (M1) 900 are formed on the third interlayer insulating layer 370. Such first metal wiring lines (M1) 900 serve as first-layer wiring lines (M1) in DRAM devices adopting a two-layer wiring line structure consisting of first-layer and second-layer wiring lines, that is, M1 and M2.

As described above, the present invention can provide a semiconductor device comprising a capacitor and a metal contact and a fabrication method thereof, in which the height of the storage node can be increased to higher capacitance while the occurrence of defects in the peripheral circuit wiring lines and the metal contact can be effectively prevented. Also, the peripheral circuit wiring lines are formed to have a double-layer structure, whereby the pattern pitch of the peripheral circuit wiring lines in peripheral circuits such as sense amplifiers (SAs) can be increased so that the peripheral circuit wiring lines can be patterned by a single patterning process without having to carry out a double patterning technology (DPT) process.

In addition, the wiring line patterns and metal contacts for the second peripheral circuit wiring lines are formed at about half of the height of the storage node, whereby the metal contacts can be formed to have a multi-layer stack structure consisting of a first metal contact and a second metal contact. Thus, the margin of the process of forming each of the first and second metal contacts can be increased, and an increase in the depth of contacts for the first and second metal contacts can be inhibited. Accordingly, the occurrence of bridges between adjacent metal contact holes can be effectively inhibited to ensure a process margin, and the interval between the metal contact and the cell region can be reduced to reduce the design rule, thus reducing the size of the chip.

Embodiments of the present invention have been disclosed above for illustrative purposes only. Those skilled in the art will appreciate that various modifications, additions and substitutions are possible, without departing from the scope and spirit of the invention as disclosed in the accompanying claims.

What is claimed is:

1. A method for fabricating a semiconductor device comprising a capacitor and a double-layer metal contact, the method comprising:
   forming a gate of a peripheral transistor for a peripheral circuit over a peripheral region of a semiconductor substrate including a cell region and the peripheral region;
   forming a first interlayer insulating layer covering the gate;
   forming a first contact and a first peripheral circuit wiring layer pattern, which are connected to the gate so as to constitute the peripheral circuit;
   forming a second interlayer insulating layer over the first interlayer insulating layer to cover the first peripheral circuit wiring layer pattern,
   wherein the second interlayer insulating layer includes a first portion and a second portion, and
   wherein the first portion of the second interlayer insulating layer is disposed in the cell region and the second portion of the second interlayer insulating layer is disposed in the peripheral region;
   forming a second peripheral circuit wiring layer pattern on the second portion of the second insulating layer and forming a second contact passing through the second interlayer insulating layer so as to constitute the peripheral circuit;
   forming a mask pattern exposing the first portion of the second interlayer insulating layer with covering the second portion of the second interlayer insulating layer;
   selectively removing the exposed whole first portion of the second interlayer insulating layer with remaining the second portion of the second interlayer insulating layer,
   wherein a portion of the first insulating layer in the cell region is exposed by the remaining second portion of the second interlayer insulating layer;

forming an etch stopper over the exposed portion of the first insulating layer with extending to cover the remaining second portion of the second interlayer insulating layer;

forming a mold layer on the etch stopper;

forming storage nodes that pass through a portion of the mold layer in the cell region;

selectively removing the mold layer to expose the storage nodes while the etch stopper protects the second portion of the second interlayer insulating layer from the removing;

forming a dielectric layer and a plate node, which cover the exposed storage nodes;

forming a third interlayer insulating layer covering the plate node; and forming third contacts that pass through the third interlayer insulating layer so as to be connected to the plate node and the second peripheral circuit wiring layer pattern, respectively.

2. The method of claim 1, wherein the peripheral circuit comprises a sense amplifier that senses data to be stored in the storage nodes.

3. The method of claim 1, wherein the method further comprises:

forming bit lines which are insulated by a portion of the first interlayer insulating layer on the cell region; and forming storage node contacts which pass through the first interlayer insulating layer so as to be connected to the storage nodes, respectively.

4. The method of claim 3, wherein forming the bit lines comprises:

forming damascene trenches in the first interlayer insulating layer; and forming the bit lines filling the damascene trenches.

5. The method of claim 1, wherein forming the first peripheral circuit wiring layer pattern comprises:

obtaining a layout of the peripheral circuit wiring line for the peripheral circuit;

extracting a layout of the first peripheral circuit wiring layer pattern, a layout of the second contact and a layout of the second peripheral circuit from the layout of the peripheral circuit wiring line;

forming a first contact hole exposing the gate; forming the first peripheral circuit wiring layer, which fills the first contact hole, on the first interlayer insulating layer; and selectively etching the first circuit wiring layer so as to have a configuration corresponding to the layout of the first peripheral circuit wiring layer pattern, thus forming the first contact and the first peripheral circuit wiring layer pattern.

6. The method of claim 1, wherein forming the second peripheral circuit wiring layer pattern comprises:

forming a second contact hole, which passes through the second interlayer insulating layer, so as to have a configuration corresponding to the layout of the second contact;

forming a second peripheral circuit wiring layer, which fills the second contact hole, on the second interlayer insulating layer; and selectively etching the second peripheral circuit wiring layer so as to have a configuration corresponding to the layout of the second peripheral circuit wiring layer pattern, thus forming the second contact and the second peripheral circuit wiring layer pattern.

7. The method of claim 1, wherein the forming the dielectric layer and the plate node comprises:

forming layers for the dielectric layer and the plate node so as to extend onto the etch stopper exposed by removal of the mold layer; and selectively etching out a portion of the dielectric layer for the plate node, which overlaps with the remaining portion of the second interlayer insulating layer, thus patterning the plate node, in which the third contacts which are connected to the plate node are located on the remaining portion of the second interlayer insulating portion.

8. The method of claim 1, wherein the method further comprises: forming on the mold layer a support layer for supporting the storage nodes.

\* \* \* \* \*